United States Patent [19]

Lentine et al.

[11] Patent Number: 4,959,534
[45] Date of Patent: Sep. 25, 1990

[54] DIFFERENTIAL OPTICAL LOGIC ARRANGEMENT

[75] Inventors: Anthony L. Lentine, St. Charles, Ill.; David A. B. Miller, Fairhaven, N.J.

[73] Assignee: AT&T Bell Laboratories, Murray Hill, N.J.

[21] Appl. No.: 399,730

[22] Filed: Aug. 28, 1989

[51] Int. Cl.$^5$ ............................................. H01J 40/14
[52] U.S. Cl. .............................. 250/213 A; 250/211 J; 377/102
[58] Field of Search ..................... 250/211 J, 213 A; 365/109, 110, 112; 377/102

[56] References Cited

U.S. PATENT DOCUMENTS

| Re. 32,893 | 3/1989 | Miller | 377/102 |
|---|---|---|---|
| 4,546,244 | 10/1985 | Miller | 250/211 J |
| 4,751,378 | 6/1988 | Hinton et al. | 250/211 J |
| 4,754,132 | 6/1988 | Hinton et al. | 250/211 J |
| 4,904,858 | 2/1990 | LaMarche | 250/213 A |
| 4,904,859 | 2/1990 | Goossen et al. | 250/211 J |
| 4,914,286 | 4/1990 | Chirovsky et al. | 250/213 A |

OTHER PUBLICATIONS

*MIT Video Course Study Guide,* Jonathan Allen, "Part 1: NMOS Integrated Circuit Design, Part II: CMOS Integrated Circuit Design", 4-8, 4-10, 5-3, 18-12, 18-13, 18-14, 18-15, 19-3, No. 78-2100.
"Photonic Ring Counter and Differential Logic Gate Using the Symmetric Self-Electrooptic Effect Device", A. L. Lentine, et al., *CLEO '88/Tuesday Morning/52*, Apr. 26.

*Primary Examiner*—Edward P. Westin
*Attorney, Agent, or Firm*—Ross T. Watland

[57] ABSTRACT

Apparatus having a first electrical circuit, comprising a plurality of photodetectors interconnected such that the first circuit corresponds to any given logic function, is connected in series with a second circuit comprising a plurality of photodetectors interconnected as the conduction complement of the connections of the first circuit. The apparatus performs optical logic without optical cascading since the first and second circuits control the generation of an optical output beam based on the value that the given logic function assumes in response to a plurality of optical signal beams incident on the photodetectors of the first circuit and a plurality of complementary beams incident on the photodetectors of the second circuit. A complementary optical output is obtained and time-sequential operation is effected when two, serially connected quantum well pin diodes comprising an S-SEED are used to generate optical output beams in response to the voltage developed by the first circuit.

17 Claims, 7 Drawing Sheets

DIFFERENTIAL OPTICAL LOGIC ARRANGEMENT

CROSS-REFERENCE TO RELATED APPLICATION

This application is related to the application A. L. Lentine et al., Case 9-33 "Single-Ended Optical Logic Arrangement", concurrently filed herewith and assigned to the assignee of the present invention.

TECHNICAL FIELD

This invention relates to optoelectronic apparatus.

BACKGROUND OF THE INVENTION

Many types of logic devices have been proposed for optical computing and photonic switching. All of these must have the gain required to cascade devices and at least a minimum functionality to perform general Boolean logic functions by optically interconnecting the devices. (It is always possible to implement a Boolean logic function using, for example, a cascaded arrangement of NOR gates.) It is clearly preferable, from an implementation standpoint, that the devices are physically, sufficiently functional to be easy to use. For example, a "three-terminal" device is clearly preferable to a "two-terminal" device because the input/output isolation afforded by three-terminal devices removes the problem of critical biasing associated with two-terminal devices. It is also desirable to provide devices that allow some choice of logical functionality. Although it is possible to construct an arbitrary optical computer from two input NOR gates alone, an improved architecture may be used when more complex gates are available. Finally, it is important that the devices operate at high speeds with low power requirements. The self electrooptic effect devices (SEEDs) disclosed in U.S. Pat. No. 4,546,244 of D. A. B. Miller, Oct. 8, 1985, satisfy all of these requirements. SEEDs rely on changes in optical absorption that are induced by changes in an electric field applied perpendicular the thin semiconductor layers in multiple quantum well material. Typically the quantum wells are contained in the intrinsic region of a reverse biased p-i-n diode. When combined with an appropriate load, the resultant device has opto-electronic feedback and bistability. Since the first demonstration of a simple resistor-biased SEED, much of the subsequent effort has concentrated on enhancing the functionality of the devices. More functionality is achieved in SEEDs by having more than one light beam incident on several p-i-n diodes. For example, by replacing the resistive load with a photodiode illuminated by a visible ($\lambda = 633$ nm) beam, a diode biased SEED (D-SEED) is operable over many decades in power by adjusting the light input on the photodiode. The beam incident on the photodiode may, for example, control the light output from the quantum well diode; such a device serves as a memory, holding its state for up to thirty seconds when both the visible and infrared beams are removed. A second example, the symmetric SEED (S-SEED) disclosed in U.S. Pat. No. 4,754,132 of H. S. Hinton et al., June 28, 1988, consists of two quantum well p-i-n diodes electrically connected in series. It has time-sequential gain, provides for signal timing regeneration, is insensitive to optical power supply fluctuations and provides effective input-output isolation. Because the signal inputs and outputs are differential in nature, specific logic power levels need not be defined and operation of the device is possible over a power range spanning several decades. Thus, the S-SEED satisfies the most basic requirement in that it is easy to use. It also has flexible logic functionality in that it can act either as an optical set-reset latch or as a differential logic gate capable of NOR OR, NAND, and AND functions as disclosed in the A. L. Lentine et al., paper "Photonic Ring Counter and Differential Logic Gate using the Symmetric Self-Electroptic Effect Device", *Conference on Lasers and Electro-Optics* (Optical Society of America), Apr., 1988. Additional functionality is obtained by extending the S-SEED concept to more than two diodes in series as in the multistate self electrooptic effect devices disclosed in U.S. Pat. No. 4,800,262 of A. L. Lentine, Jan. 24, 1985. M-SEEDS may operate as optically enabled S-SEEDs, image thresholding devices, or multi-input selection devices.

The P. Wheatley et al. paper, "Hard Limiting Optoelectronic Logic Devices", *Photonic Switching: Proceedings of the First Topical Meeting*, March. 1987, discloses two opto-electronic devices suitable for optical logic. Both devices have a phototransistor in series with an electro-absorption modulator between a constant supply voltage and ground. A beam of constant optical power, the pump power, is incident on the modulator; part of this is absorbed by the modulator to give rise to photocurrent and part is transmitted to give the optical output of the device. Thus the device is an optical three terminal device since the output power is derived from a constant optical supply which does not follow the same path as the input signal. The first device disclosed in the Wheatley paper is an inverting device where the wavelength of the pump beam is such that the modulator photocurrent increases with the applied reverse bias voltage. In the second, non-inverting device, the modulator absorption decreases with applied reverse bias voltage. As disclosed, multiple-input logic gates are made by employing several phototransistors. Using the wavelength of the first, inverting device, a NOR gate may be made if two phototransistors are connected in parallel, and a NAND gate if they are connected in series. The second, noninverting device may be made into an OR or AND gate with the transistors in parallel or series respectively. However, unlike the known S-SEED differential logic arrangements referenced above, the disclosed Wheatley devices implement single-ended logic. In many applications, differential logic is preferable. A problem with the referenced S-SEED differential logic arrangements is that optical cascading is required to implement more complex logic functions, for example, $E = AB + CD$, and corresponding increased optical delays and losses result because of the cascading.

In view of the foregoing, a need exists in the art for a differential, optical logic arrangement that is usable to implement complex logic functions without cascading.

SOLUTION

This need is met and a technical advance is achieved in accordance with the principles of the invention in an exemplary apparatus where a first electrical circuit, comprising a plurality of photodetectors interconnected such that the first circuit corresponds to, significantly, any given logic function, is connected in series with a second circuit comprising a plurality of photodetectors interconnected advantageously as the conduction complement of the connections of the first circuit, and where the apparatus performs optical logic without optical cascading since the first and second circuits control the generation of an optical output beam based on the value that the given logic function assumes in response to a plurality of optical signal beams incident on the photodetectors of the first circuit and a plurality of complementary beams incident on the photodetectors of the second circuit. Illustratively, a complementary optical output is obtained and time-sequential operation is effected when two, serially connected quantum well p-i-n diodes comprising a S-SEED are used to generate optical output beams in response to the voltage developed by the first circuit.

Apparatus in accordance with the invention comprises first and second electrical circuits connected in series for connection across a voltage source. The first circuit is responsive to a plurality of optical signal beams and comprises a plurality of photodetectors each having at least one of the optical signal beams incident thereon. The photodetectors are interconnected such that the first circuit corresponds to a logic function of the plurality of optical signal beams. The second circuit, which is responsive to a plurality of beams each complementary to one of the optical signal beams, comprises a plurality of photodetectors each having at least one of the complementary beams incident thereon. The photodetectors of the second circuit are interconnected as a conduction complement of the connections of the first circuit.

Illustratively, any AND and NAND operations of the logic function correspond to series connections within the first circuit and parallel connections within the second circuit, and any OR and NOR operations of the logic function correspond to parallel connections within the first circuit and series connections within the second circuit. An output device is electrically controlled by the first and second circuits to generate an optical output beam at a first logic value when the logic function of the plurality of optical signal beams is a first value, and at a second logic value when the logic function is a second value. The power of the optical signal beams and the complementary beams may be controlled, for example using optical attenuators, such that an initial photocurrent generated by the second circuit is greater than an initial photocurrent generated by the first circuit when the logic function is the first value and an initial photocurrent generated by the second circuit is less than an initial photocurrent generated by the first circuit when the logic function is the second value.

In the exemplary embodiments disclosed herein, the photodetectors of the first and second circuits are implemented as quantum well p-i-n diodes. Although not needed for optical modulation, the quantum wells result in improved switching performance of the diodes.

The first and second circuits control the generation of an optical output beam and a complementary beam by a pair of series-connected quantum well p-i-n diodes comprising a S-SEED. The optical signal beams are first applied to set the state of the apparatus and optical clock beams are then applied to the p-i-n diodes of the S-SEED to read the state of the apparatus in time sequential fashion.

DRAWING DESCRIPTION

FIG. 1 is a general circuit diagram for differential optical logic arrangements illustrative of the present invention; and FIGS. 2–7 are circuit diagrams for specific embodiments of arrangements of the type shown in FIG. 1.

DETAILED DESCRIPTION

Figure 1:
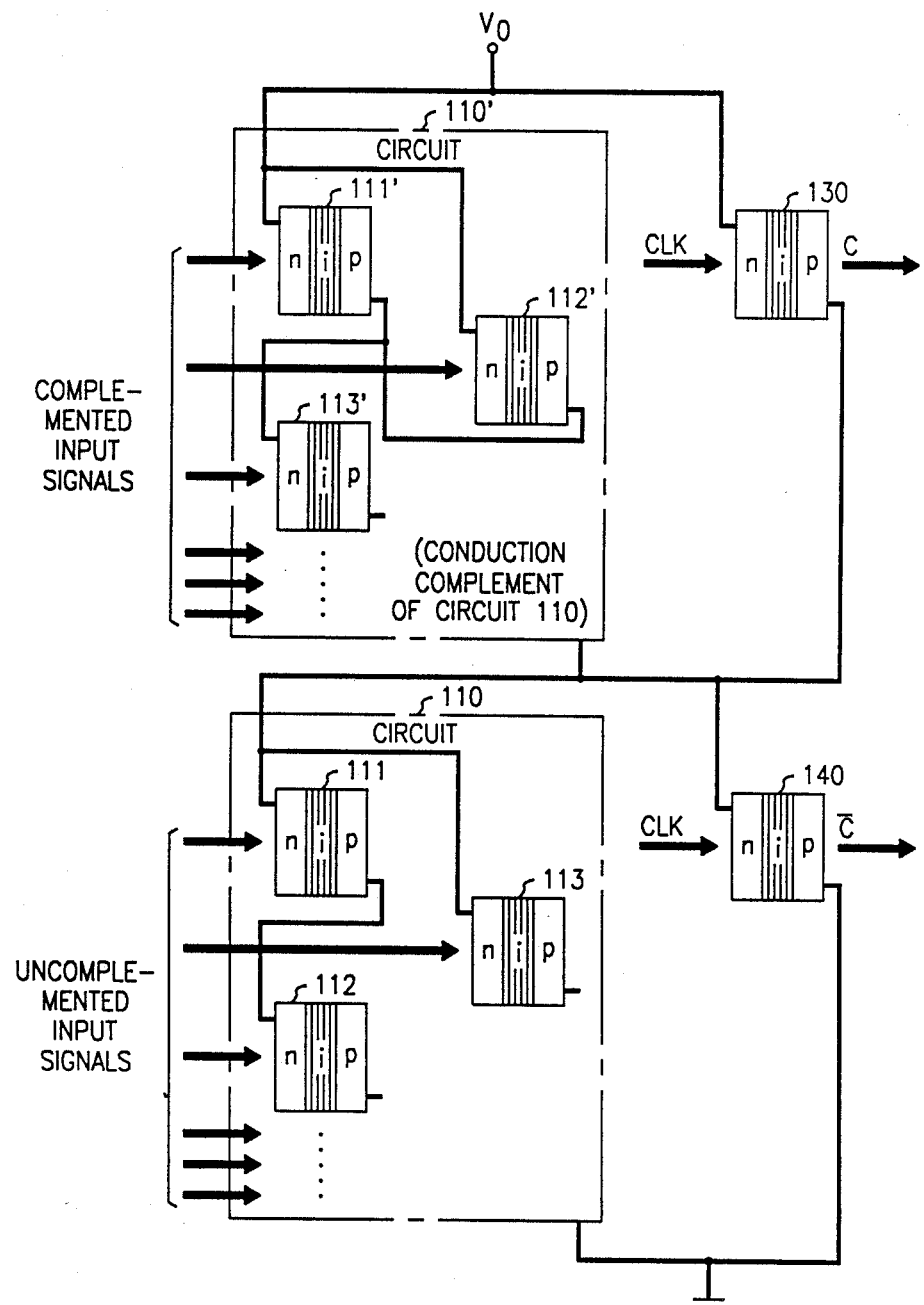

FIG. 1 is a general circuit diagram for differential optical logic arrangements illustrative of the present invention. The differential logic arrangements avoid critical biasing, have time sequential gain, good input-/output isolation and signal re-timing. In addition, the arrangements do not require a reference signal. Although in many cases the same quantum well p-i-n diodes are used for the detection and modulation processes, for simplicity, the circuits described herein have separate diodes on which the input signals are incident and separate diodes on which the clock beams that generate the output beams are incident. Also, the diodes that do not generate output beams do not need quantum wells, although improved switching performance results if they do. The improved switching performance results from the increase in absorption of the quantum well diode with reducing voltage; this change in absorption tends to further enhance the difference in photocurrents between the diodes, hence switching them faster. Each logical input uses two complementary beams to represent the logic state. If the power of the uncomplemented beam is greater than the complemented beam, this input will be defined as a logic "one"; a logic "zero" is the reverse case. Two sets of p-i-n diodes accept the incident input signals, circuit 110 including diodes 111, 112, 113, etc., with uncomplemented input signals, and circuit 110' including diodes 111', 112', 113', etc., with complemented input signals. The diodes in circuit 110' are electrically interconnected in manner known as the conduction complement of the connections of the diodes in circuit 110. For example, if circuit 110 consists of serially connected diodes, then circuit 110' consists of parallel-connected diodes. The voltage at the interconnecting node between circuit 110 and circuit 110' is connected to the center node of an output S-SEED having two series-connected quantum well p-i-n diodes 130 and 140. This node voltage determines the state of the apparatus. For non-inverting functions (i.e. ANDs and ORs), output C is the uncomplemented output, and output $\overline{C}$ is the complemented output. For inverting functions (i.e. NANDs and NORs), the outputs are reversed. That is, the output labeled C becomes the complemented output, the output labeled $\overline{C}$ becomes the uncomplemented output. In either case, the output state is defined to be a logic "one" when the power of the uncomplemented output beam is greater than that of the complemented output beam.

In operation, first the signal beams are applied to the respective diodes. The voltage that is present on the node between the two sets of "signal" diodes is a function of the currents generated by the diodes. The voltage across circuit 110' in FIG. 1 is essentially zero when the logic function is not satisfied, and the output is a logic "zero" (output $\overline{C}$ greater than C). This occurs if the photocurrent generated by circuit 110 is initially less than that generated by circuit 110'. Conversely, the voltage across circuit 110' is essentially equal to the supply voltage $V_0$ when the logic function is satisfied and the output is a logic "one" (output C greater than $\overline{C}$). This occurs if the photocurrent generated by circuit 110 is initially greater than that generated by circuit 110'. These two cases are satisfied provided that the input signals have sufficient contrast ratios. Optical attenuators may be inserted in the paths of certain input signals, to operate the apparatus optimally for low contrast ratios. If quantum well p-i-n diodes are used for the detector diodes, there is a range of input power levels where bistability exists; this places a lower limit on the contrast ratio of the input signals. However, if the supply voltage $V_0$ is ramped up from zero during the application of the input signals, effectively removing any bistable characteristics, the apparatus works with any input contrast greater than one. The node between the two groups of input diodes is electrically connected to the node between the two diodes 130 and 140 of the output S-SEED. Therefore, once the voltage at this point has been determined (i.e. after the switching time of the circuit), the signal beams are removed and clock beams of higher power subsequently applied, thereby achieving time-sequential gain.

Figure 2:
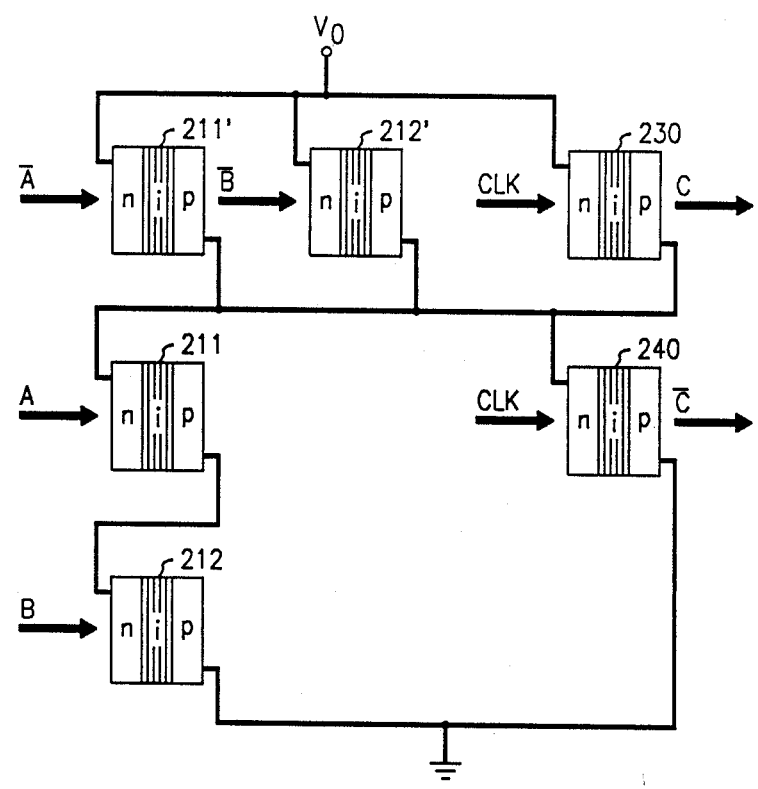

The arrangement of FIG. 2 implements a differential AND gate. The two complementary input signals are represented by light beams A and $\bar{A}$ and light beams B and $\bar{B}$. A pair of clock beams, incident on the output S-SEED comprising diodes 230 and 240, generate output beams C and $\bar{C}$. The two uncomplemented signals, A and B, are incident on two serially connected diodes 211 and 212, and the complemented signals, $\bar{A}$ and $\bar{B}$, are incident on two parallel-connected diodes 211' and 212'. If either or both of the beams A and B are low, one or both of the beams $\bar{A}$ and $\bar{B}$ must be high, because the input signals are complementary. Therefore, the current generated by the serially connected diodes 211 and 212 is initially less than that generated by the parallel-connected diodes 211' and 212' (for any contrast). Accordingly, the voltage at the center node of the output S-SEED is essentially equal to the supply voltage $V_0$. Thus, when the clock beams are applied, the output is a logic "zero" because output beam C is "low" and output beam $\bar{C}$ is "high". If input beams A and B are both "high", input beams $\bar{A}$ and $\bar{B}$ are both "low" because they are complementary to input beams A and B. Assuming that the sum of optical powers of the two "low" beams is less than that of one "high" beam, the current generated by serially connected diodes 211 and 212 is initially greater than that generated by the parallel connected diodes 211' and 212'. In this case, the voltage at the center node of the output S-SEED is essentially equal to zero. When the clock beams are applied, output C is "high" and output $\bar{C}$ low, and thus the output state is a logic "one". Therefore, this logic arrangement performs an AND function. Conversely, if the output state is defined as being a logic "one" when the power in output beam $\bar{C}$ is greater than that of beam C, then the arrangement performs a NAND function.

Figure 3:
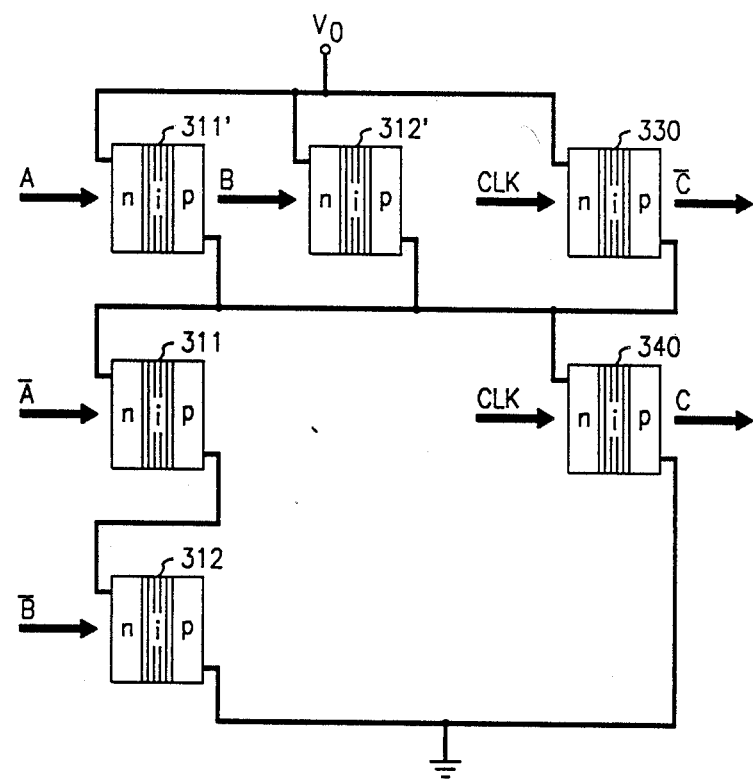

The arrangement of FIG. 3 implements a differential OR/NOR gate. This arrangement, comprising diodes 311, 312, 311', 312', 330 and 340, is identical to the AND/NAND arrangement of FIG. 2 with the inputs and outputs reversed. If a logic "one" is defined by the power of output beam C being greater than that of output beam $\bar{C}$, then this arrangement performs an OR function. Similarly, if the output is a logic "one" when the power of output beam $\bar{C}$ is greater than that of output beam C, then the arrangement performs a NOR function.

An N input logic gate can be realized in a similar manner. Instead of two serially connected diodes, N (uncomplemented) input signals are incident on N serially connected diodes, and N complemented signals are incident on N parallel-connected diodes. As an example, an N input AND gate has the desired output a logic "one" if all inputs are logic "ones", and a logic "zero" if at least one input is a logic "zero". These two conditions are satisfied if $P_{LOGIC\ 1} > NP_{LOGIC\ 0}$ and $P_{LOGIC\ 0} < P_{LOGIC\ 1} + (N-1)P_{LOGIC\ 0}$. The first condition is only satisfied for input contrast ratios greater than N:1, and the second condition is always satisfied. An attenuator added in the path of the input beams incident on the parallel-connected diodes that transmits 1/N of the incident power enables this arrangement to be used for any contrast ratio (assuming the bistable characteristics are removed).

Figure 4:
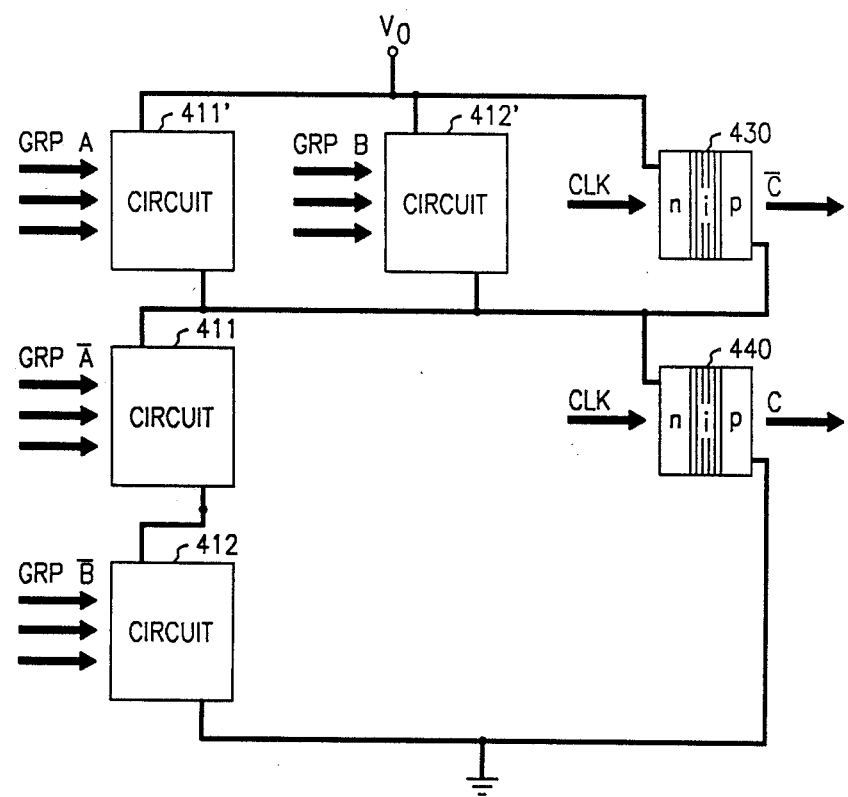
Figure 5:
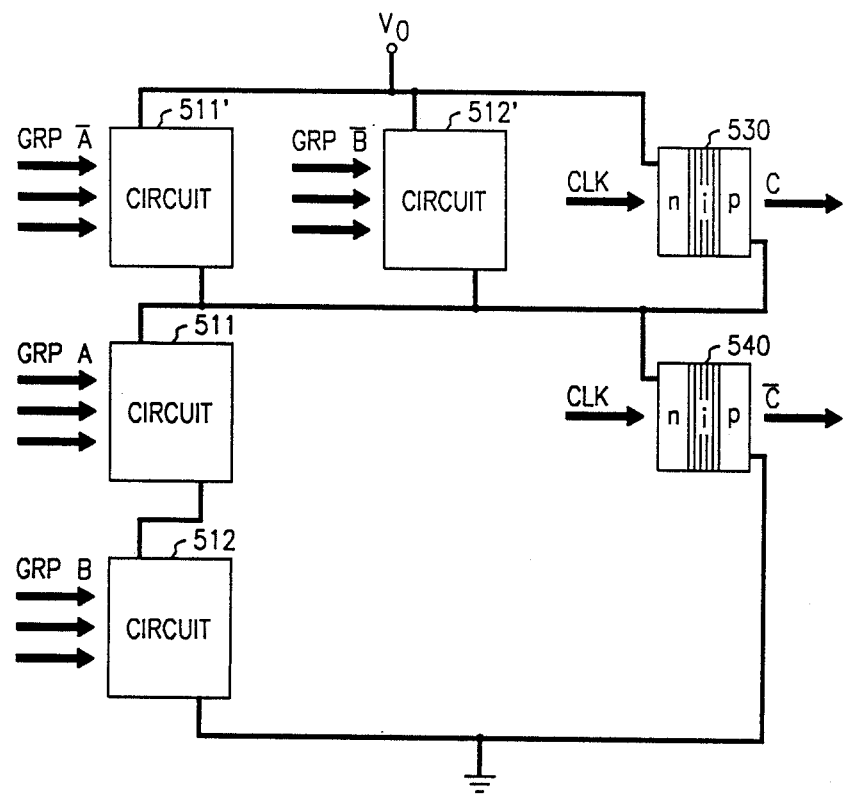

An important advantage of differential optical logic arrangements of the type shown in FIG. 1 relates to the implementation of arbitrary functions with such arrangements. For the uncomplemented signals, the OR (FIG. 4) and AND (FIG. 5) of two subfunctions is achieved by electrically connecting their respective circuits of p-i-n diodes in parallel and series respectively. However, the circuits of diodes with incident complemented signals, are connected in series and parallel for OR and AND functions respectively. The diodes with the uncomplemented inputs are connected in series with the diodes with the complemented inputs. The center node between these two groups of diodes is connected to the center node of the output S-SEED, and the voltage on this node determines the relative outputs of the S-SEED.

Figure 6:
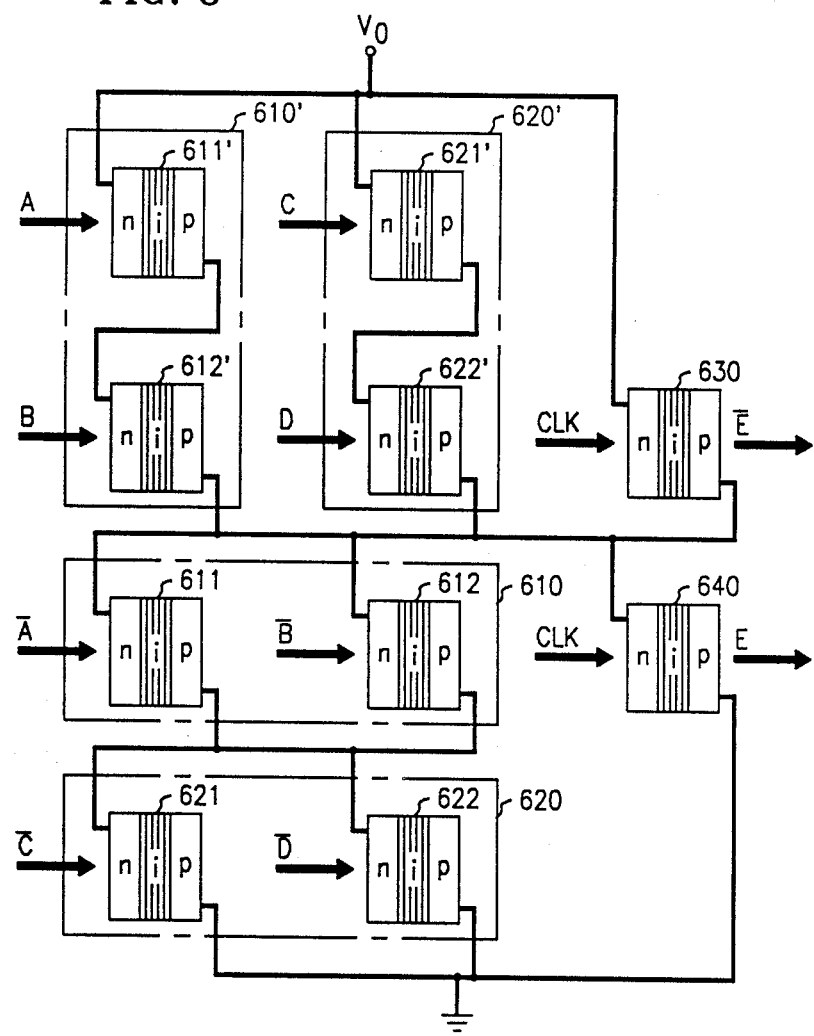

As an example, consider a function given by $E = AB + CD$. The differential logic arrangement of FIG. 6 implements this function. Circuit 610' consists of two diodes 611' and 612' with incident input beams A and B connected electrically in series. Circuit 610 consists of two diodes 611 and 612 with incident input beams $\bar{A}$ and $\bar{B}$ connected electrically in parallel. Circuit 610' and 610 implement an AND function of A and B. Similarly, circuit 620' consists of two diodes 621' and 622' with incident input beams C and D connected electrically in series, and circuit 620 consists of two diodes 621 and 622 with incident input beams $\bar{C}$ and $\bar{D}$ connected electrically in parallel. Circuits 620' and 620 implement the AND function of C and D. To implement the OR of AB and CD, circuits 610' and 620' are connected in parallel and circuits 610 and 620 in series.

A general logic arrangement is made as follows. Referring to FIG. 1, circuit 110 consists of p parallel-connected groups of $s_p$ serially connected diodes. Circuit 110' consists of p serially connected groups of $s_p$ parallel-connected diodes. In this arrangement, no attenuators are needed to ensure operation of the logic function at any contrast ratio greater than one, assuming no bistability while the input signals are applied and provided that $s_p = p$.

Figure 7:
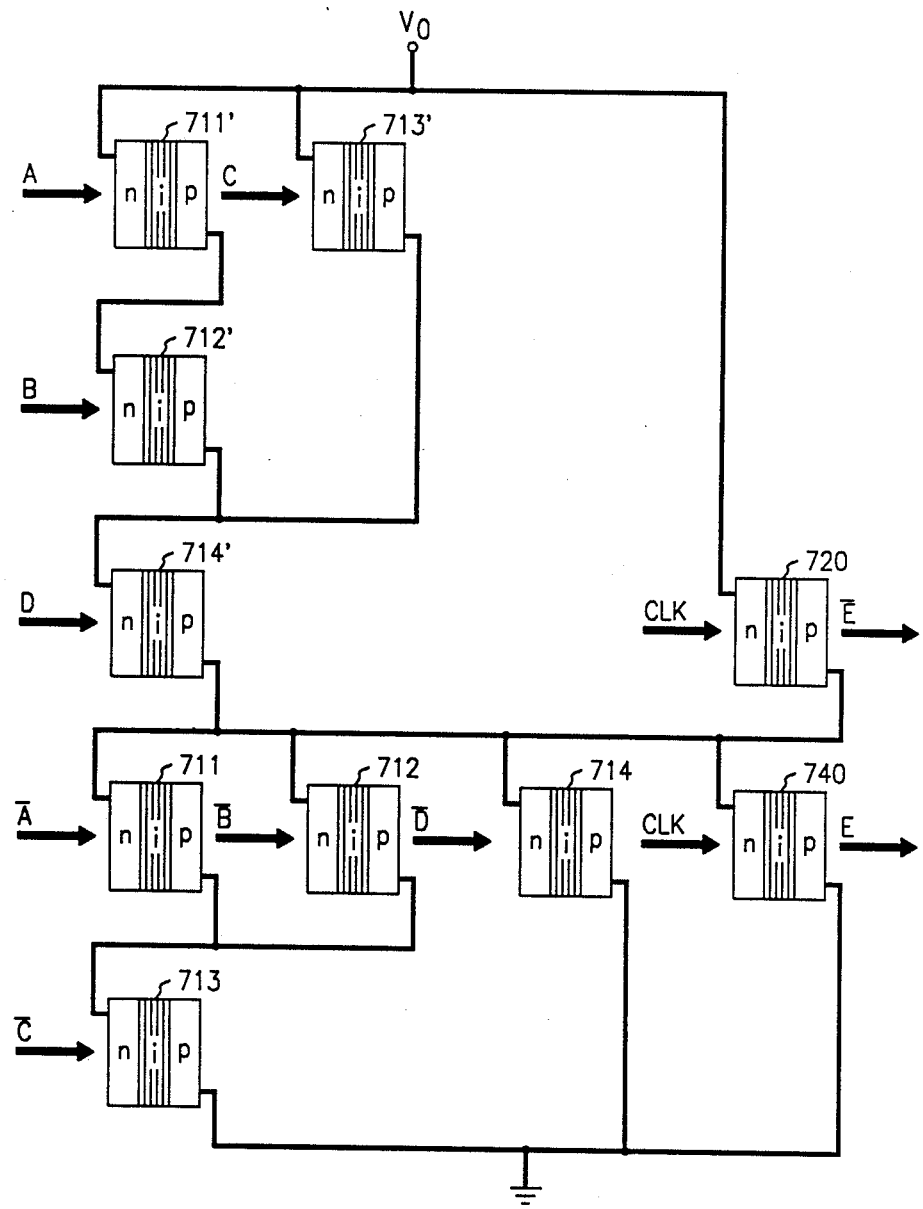

Next consider another arbitrary function given by $E = (AB + C)D$. The arrangement for implementing this function in differential logic is shown in FIG. 7. The contrast ratio of the input signals must be greater than 3:1 for the arrangement to operate properly, because a logic "one" for input D must generate more current than the sum of the currents generated by logic "zeros" for inputs $\bar{A}$, $\bar{B}$, and $\bar{D}$. To operate at any contrast ratio greater than one, signals $\bar{A}$ and $\bar{B}$ must be attenuated by 75%, signals A, B, C, $\bar{C}$ and $\bar{D}$ need to be attenuated by 50%, and signal D is unattenuated.

It is to be understood that the above-described embodiments are merely illustrative of the principles of the invention and that many variations may be devised by those skilled in the art without departing from the spirit and scope of the invention. It is therefore intended that such variations be included within the scope of the claims.

We claim:

1. Apparatus comprising
   first and second electrical circuits connected in series for connection across a voltage source,
   said first circuit being responsive to a plurality of optical signal beams and comprising a plurality of photodetector means each having at least one of said optical signal beams incident thereon and being interconnected such that said first circuit corresponds to a logic function of said plurality of optical signal beams,
   said second circuit being responsive to a plurality of beams each complementary to one of said optical signal beams and comprising a plurality of photodetector means each having at least one of said complementary beams incident thereon and being interconnected as a conduction complement of the connections of said first circuit.

2. Apparatus in accordance with claim 1 where any AND and NAND operations of said logic function correspond to series connections within said first circuit and parallel connections within said second circuit and where any OR and NOR operations of said logic function correspond to parallel connections within said first circuit and series connections within said second circuit.

3. Apparatus in accordance with claim 1 wherein each of said photodetector means of said first and second circuits comprises a p-i-n diode.

4. Apparatus in accordance with claim 1 wherein each of said photodetector means of said first and second circuits includes a semiconductor quantum well region.

5. Apparatus in accordance with claim 1 further comprising
   means, connectable to said voltage source and electrically controlled by said first and second circuits, for generating an optical output beam at a first logic value when said logic function of said plurality of optical signal beams is a first value, and at a second logic value when said logic function of said plurality of optical signal beams is a second value.

6. Apparatus in accordance with claim 5 further comprising
   means, connectable to said voltage source and electrically controlled by said first and second circuits, for generating a beam that is complementary to said optical output beam.

7. Apparatus in accordance with claim 6 wherein said means for generating a beam that is complementary to said optical output beam includes a semiconductor quantum well region.

8. Apparatus in accordance with claim 6 wherein said means for generating a beam that is complementary to said optical output beam comprises a p-i-n diode.

9. Apparatus in accordance with claim 5 wherein said generating means comprises
   optical modulator means responsive to an optical clock beam for generating said optical output beam.

10. Apparatus in accordance with claim 9 wherein said plurality of optical signal beams and said plurality of complementary beams are first applied to set the state of said apparatus and said optical clock beam is subsequently applied to read the state of said apparatus.

11. Apparatus in accordance with claim 10 further comprising
   means, connectable to said voltage source and electrically controlled by said first and second circuits, for generating a beam that is complementary to said optical output beam.

12. Apparatus in accordance with claim 9 wherein said optical modulator means includes a semiconductor quantum well region.

13. Apparatus in accordance with claim 9 wherein said optical modulator means comprises a p-i-n diode.

14. Apparatus in accordance with claim 1 where the powers of said optical signal beams and said complementary beams are such that an initial photocurrent generated by said second circuit is greater than an initial photocurrent generated by said first circuit when said logic function of said optical signal beams is said first value and an initial photocurrent generated by said second circuit is less than an initial photocurrent generated by said first circuit when said said logic function of said optical signal beams is said second value.

15. Apparatus comprising
   a first electrical circuit responsive to a plurality of optical signal beams and comprising a plurality of photodetector means each having at least one of said optical signal beams incident thereon and being interconnected such that said first circuit corresponds to a logic function of said plurality of optical signal beams, and
   a second electrical circuit responsive to a plurality of beams each complementary to one of said optical signal beams and comprising a plurality of photodetector means each having at least one of said complementary beams incident thereon and being interconnected as the conduction complement of the connections of said first circuit,
   said first and second circuits being connected in series for connection across a voltage source such that said first circuit develops a voltage at a first level when said logic function of said plurality of optical signal beams is a first values and at a second level when said logic function of said plurality of optical signal beams is a second value.

16. Apparatus in accordance with claim 15 further comprising
   means electrically connected to said first and second circuits for generating an optical output beam having a first logic value in response to said first level of said voltage and having a second logic value in response to said second level of said voltage.

17. Apparatus comprising
   a symmetric self electro-optic effect device comprising a first p-i-n diode having quantum wells in an intrinsic region thereof and responsive to an optical clock beam for generating an optical output beam, said first p-i-n diode having a first terminal connectable to a first terminal of a voltage source, said device further comprising a second p-i-n diode having quantum wells in an intrinsic region thereof and responsive to an optical clock beam for generating a beam that is complementary to said optical output beam, said first p-i-n diode having a first terminal connectable to a second terminal of said first p-i-n diode and having a second terminal connectable to a second terminal of said voltage source,
   a first plurality of p-i-n diodes interconnected to form a first electrical circuit corresponding to a logic function of a plurality of optical signal beams, said first circuit having a first terminal connectable to said second terminal of said voltage source and having a second terminal connected to said second terminal of said first p-i-n diode and said first terminal of said second p-i-n diode, each of said p-i-n diodes of said first circuit having at least one of said optical signal beams incident thereon, and a second plurality of p-i-n diodes interconnected as a conduction complement of the connections of said first circuit to form a second electrical circuit responsive to a plurality of beams each complementary to one of said optical signal beams, said second circuit having a first terminal connectable to said first terminal of said voltage source and having a second terminal connected to said second terminal of said first p-i-n diode and said first terminal of said second p-i-n diode, each of said p-i-n diodes of said second circuit having at least one of said plurality of complementary beams incident thereon.

* * * * *